(12) United States Patent
Fang

(10) Patent No.: US 6,838,311 B2
(45) Date of Patent: Jan. 4, 2005

(54) FLIP CHIP PACKAGE AND METHOD FOR FORMING THE SAME

(75) Inventor: Jen-Kuang Fang, Pin Tung Hsien (TW)

(73) Assignee: Advanced Semiconductor Engineering, Inc., Kaoshiung (CN)

( * ) Notice: Subject to any disclaimer, the term of this patent is extended or adjusted under 35 U.S.C. 154(b) by 0 days.

(21) Appl. No.: 10/269,910

(22) Filed: Oct. 11, 2002

(65) Prior Publication Data

US 2003/0082852 A1 May 1, 2003

(30) Foreign Application Priority Data

Oct. 12, 2001 (TW) ........................................ 90125239 A

(51) Int. Cl.[7] .............................................. H01L 21/44
(52) U.S. Cl. .................... 438/106; 438/51; 438/108; 438/778
(58) Field of Search .................... 438/51, 106, 108, 438/778

(56) References Cited

U.S. PATENT DOCUMENTS 6,214,635 B1 * 4/2001 Akram et al. .................. 438/51

* cited by examiner

Primary Examiner—David Nelms
Assistant Examiner—Renee R. Berry
(74) Attorney, Agent, or Firm—Ladas & Parry LLP

(57) ABSTRACT

The present invention relates to a flip chip package comprising a chip assembly, a substrate, and an underfill material. The chip assembly has at least one chip. Each chips has a plurality of bond pads formed on a bottom portion of the chip. Each bond pad has a first solder bump formed on the bond pad. The chips are packaged by molding compound to form the chip assembly. The chip assembly has a bottom surface exposing a portion of the first solder bumps. The substrate has a plurality of support pads formed on a top surface of the substrate. Each support pad has a second solder bump formed on the support pad. The first solder bumps electrically connect to the second solder bumps to support the chip assembly by the substrate. The underfill material fills into a gap between the bottom surface of the chip assembly and the top surface of the substrate so as to form the flip chip package. Therefore, when the flip chip package structure is cut into a piece of flip chip package, the chip will not break because there is molding compound around the chip. Besides, a logo or company name is printed on the molding compound, not on the chip directly, so it will not hurt the chip. According to the invention, the product yield rate can be improved.

3 Claims, 4 Drawing Sheets

FLIP CHIP PACKAGE AND METHOD FOR FORMING THE SAME

BACKGROUND OF THE INVENTION

1. Field of the Invention

The present invention relates to a package structure, more particularly, to a flip chip package and a method for forming the flip chip package.

2. Description of the Related Art

As shown in FIG. 1, a conventional flip chip package structure 1 comprises a chip 11 and a substrate 12. The chip 11 has a plurality of bond pads 111 and 112 formed on a bottom portion of the chip 11. A plurality of first solder bumps 113 and 114 are formed on the bond pads 111 and 112. The substrate 12 has a plurality of support pads 121 and 122 formed on a top surface of the substrate 12. A plurality of second solder bumps 123 and 124 are formed on the support pads 121 and 122. The first solder bumps 113 and 114 are electrically connected to the second solder bumps 123 and 124, respectively.

An underfill material 13, for example silver paste, is filled into a gap between the bottom portion of the chip 11 and the top surface of the substrate 12 so as to further fix the connection of the chip 11 and the substrate 12 and form the flip chip package structure 1.

However, the flip chip package structure 1 is manufactured in hatch. That is, a plurality of chips are connected to the substrate to form a whole flip chip package. Then the whole flip chip package is cut into a piece of the flip chip package structure 1. By using the above method, the chip 1 may be broken when cutting. The product yield rate is low.

Besides, a logo or company name should be printed on the top surface of the chip 11 by laser print method. The laser print method may hurt the chip 11.

Therefore, it is necessary to provide a flip chip package structure and a method for forming the flip chip package to solve the above problem.

SUMMARY OF THE INVENTION

One objective of the present invention is to provide a flip chip package. The flip chip package comprises a chip assembly, a substrate, and an underfill material. The chip assembly has at least one chip. Each chips has a plurality of bond pads formed on a bottom portion of the chip. Each bond pad has a first solder bump formed on the bond pad. The chips are packaged by molding compound to form the chip assembly. The chip assembly has a bottom surface exposing a portion of the first solder bumps. The substrate has a plurality of support pads formed on a top surface of the substrate. Each support pad has a second solder bump formed on the support pad. The first solder bumps electrically connect to the second solder bumps to support the chip assembly by the substrate. The underfill material fills into a gap between the bottom surface of the chip assembly and the top surface of the substrate so as to form the flip chip package.

Therefore, when the flip chip package structure is cut into a piece of flip chip package, the chip will not break because there is a molding compound around the chip. Besides, a logo or company name is printed on the molding compound, not on the chip directly, so it will not hurt the chip. According to the invention, the product yield rate can be improved.

DETAILED DESCRIPTION OF THE INVENTION

Figure 1:
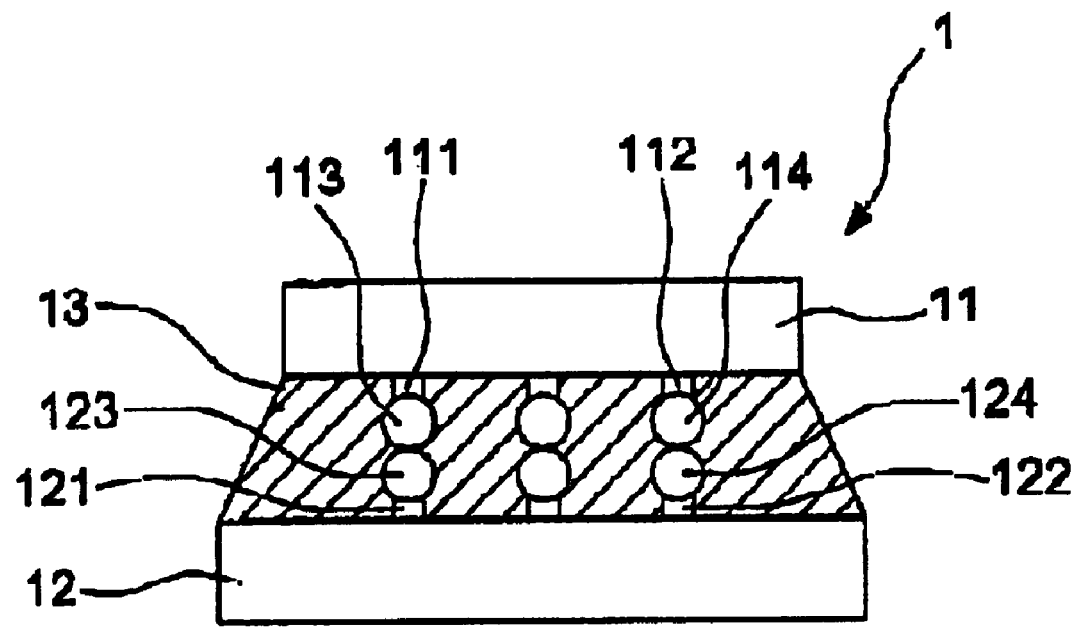
FIG. 1 shows a cross-sectional view of a conventional flip chip package.
Figure 2:
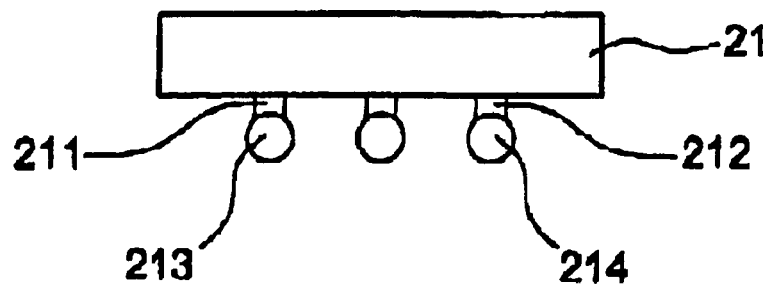
FIG. 2 shows a cross-sectional view of forming the bond pads and the first solder bumps on a chip according to the invention.

FIGS. 2 to 7 show the steps of forming a flip chip package according to the first embodiment of the invention. As shown in FIG. 2, a plurality of bond pads 211, 212 are formed on a bottom portion of a chip 21. Then a plurality of first solder bumps 213, 214 are formed on the bond pads 211, 212. The first solder bumps 213 and 214 contain tin (Sn) and lead (Pb). The proportion of the tin and the lead may be 97% Sn and 3% Pb, 95% Sn and 5% Pb, 90% Sn and 10% Pb, or 63% Sn and 37% Pb.

Figure 3:
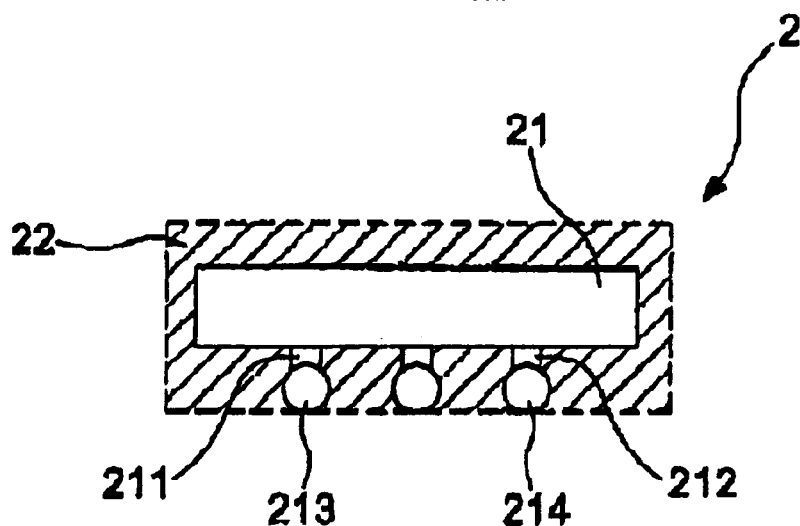
FIG. 3 shows a cross-sectional view of forming a chip assembly according to the invention.

Referring to FIG. 3, the chip 21 is packaged by a mould compound 22 to form a chip assembly 2. Therefore, the chip assembly 2 comprises a chip 21, mould compound 22, the bond pads 211, 212 and the first solder bumps 213, 214.

Figure 4:
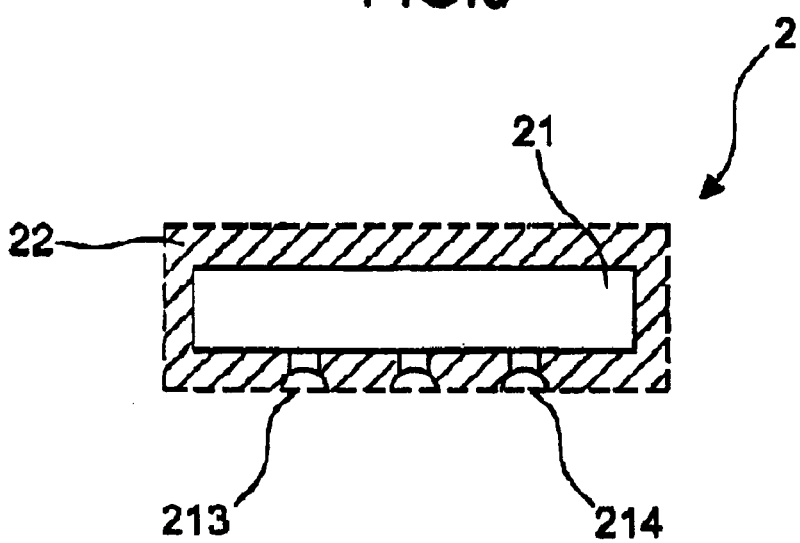
FIG. 4 shows a cross-sectional view of grinding a bottom portion of the chip assembly according to the invention.

Because the chip 21 is surrounded with the mould compound 22, it is necessary to grind a bottom surface of the chip assembly 2 so as to expose a portion of the first solder bumps 213, 214 on the bottom surface of the chip assembly 2, as shown in FIG. 4. The exposed portion of the first solder bumps 213, 214 can be the contact points with the other element.

Figure 5:
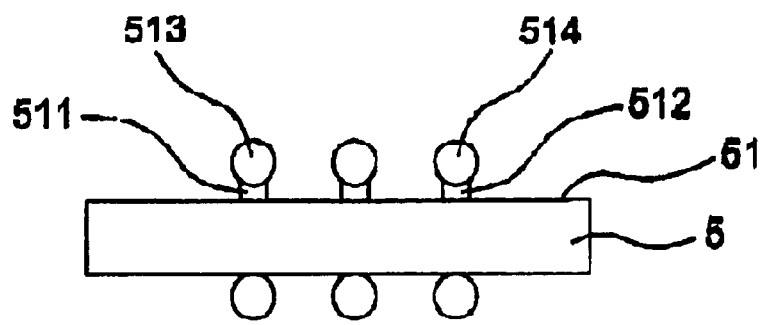
FIG. 5 shows a cross-sectional view of forming the support pads and the second solder bumps on a substrate according to the invention.

Referring to FIG. 5, a plurality of support pads 511, 512 are formed on a top surface 51 of a substrate 5. Then a plurality of second solder bumps 513, 514 are formed on the support pads 511, 512. The second solder bumps 513 and 514 contain tin (Sn) and lead (Pb). The proportion of lead is lower than that of tin, and the melting point of the second solder bumps is lower than that of the first solder bumps.

Figure 6:
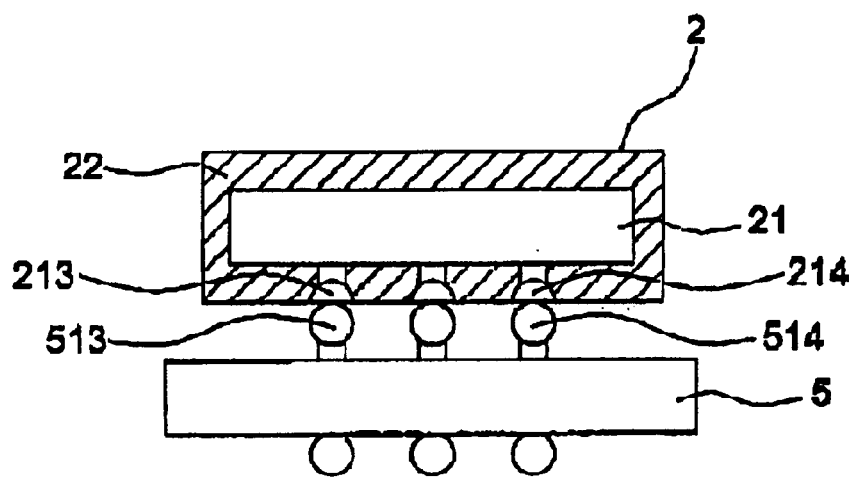
FIG. 6 shows a cross-sectional view of connecting the chip assembly and the substrate according to the invention.

By the difference of the melting point between the first solder bumps and the second solder bumps, the first solder bumps 213, 214 are connected to the second solder bumps 513, 514, respectively. Accordingly, the substrate 5 supports and electrically connects the chip assembly 2, as shown in FIG. 6.

Figure 7:
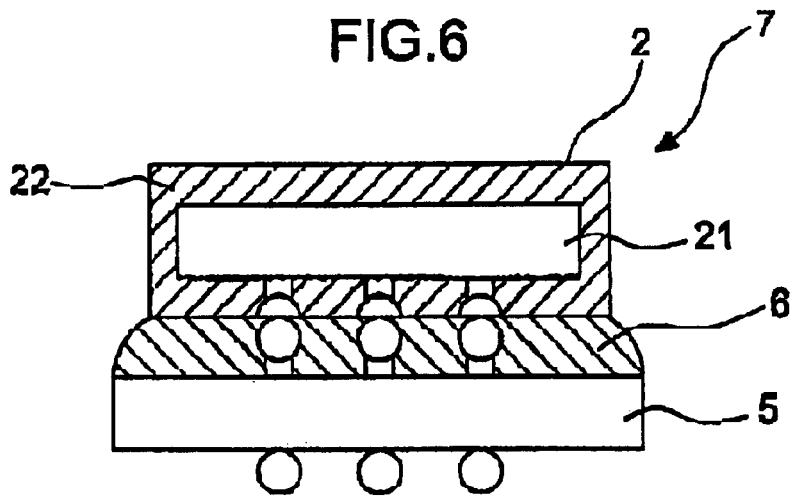
FIG. 7 shows a cross-sectional view of a flip chip package according to the invention.

Referring to FIG. 7, an underfill material 6, for example silver paste or mould compound, fills into a gap between the bottom surface of the chip assembly 2 and the top surface 51 of the substrate 5 so as to form the flip chip package 7. Therefore, when the flip chip package structure 7 is cut into a piece of flip chip package, the chip will not break because there is molding compound 22 around the chip 21. Besides, a logo or company name is printed on the molding compound 22, not on the chip 21 directly, so it will not hurt the chip 21. According to the invention, the product yield rate can be improved.

Figure 8:
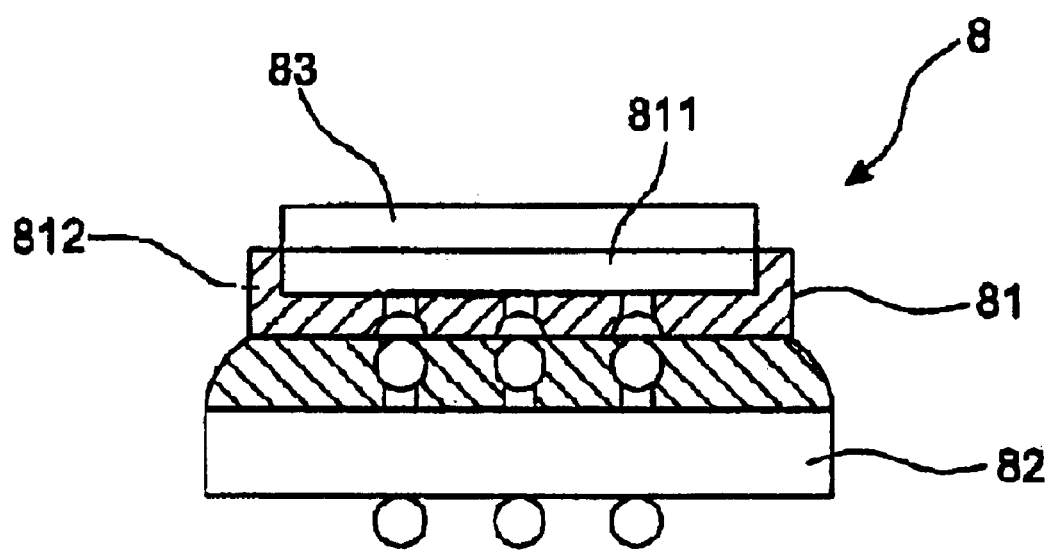
FIG. 8 shows a cross-sectional view of a flip clip package according to the second embodiment of the invention.

Referring to FIG. 8, it shows a flip chip package 8 according to the second embodiment of the invention. The flip chip package 8 comprises a chip assembly 81 and a substrate 82. The chip assembly 81 has a chip 811 and a molding compound 812 for packaging the chip 811. The molding compound 812 does not entirely surround the chip 811, and a heat sink 83 is installed on a top of the chip 811 so as to improve the heat dissipation.

While embodiments of the present invention have been illustrated and described, various modifications and improvements can be made by persons skilled in the art. The embodiments of the present invention are therefore described in an illustrative but not restrictive sense. It is declared that the present invention may not be limited to the particular forms as illustrated, and that all modifications which maintain the spirit and scope of the present invention are within the scope as defined in the appended claims.

What is claimed is:

1. A flip chip package, comprising:
   a chip assembly, having at least one chip, each chip having a plurality of bond pads formed on a bottom portion of the chip, each bond pad having a first solder bump formed thereon, the chip packaged by molding compound to form the chip assembly, the chip assembly having a bottom surface exposing a portion of the first solder bumps;
   a substrate, having a plurality of support pads formed on a top surface of the substrate, each support pad having a second solder bump formed thereon, the first solder bumps electrically connected to the second solder bumps to support the chip assembly by the substrate; and
   an underfill material, filling into a gap between the bottom surface of the chip assembly and the top surface of the substrate.

2. The flip chip package according to claim 1, wherein the first solder bump contains tin (Sn) and lead (Pb), the second solder bump contains tin (Sn) and lead (Pb), and the melting point of the second solder bumps is lower than that of the first solder bumps.

3. The flip chip package according to claim 1, further comprising at least one heat sink formed on a top portion of the chip.

* * * * *